(12) United States Patent
Chawla et al.

(10) Patent No.: US 8,872,481 B2
(45) Date of Patent: Oct. 28, 2014

(54) SYSTEMS AND METHODS FOR PREDICTING BATTERY POWER-DELIVERY PERFORMANCE

(75) Inventors: Monika Chawla, Bangalore (IN); Necip Doganaksoy, Niskayuna, NY (US); Herman Wiegman, Niskayuna, NY (US)

(73) Assignee: General Electric Company, Niskayuna, NY (US)

(*) Notice: Subject to any disclaimer, the term of this patent is extended or adjusted under 35 U.S.C. 154(b) by 595 days.

(21) Appl. No.: 13/095,743

(22) Filed: Apr. 27, 2011

(65) Prior Publication Data

US 2012/0274285 A1 Nov. 1, 2012

(51) Int. Cl.
*H02J 7/00* (2006.01)
*H01M 10/44* (2006.01)
*G01R 31/36* (2006.01)

(52) U.S. Cl.
CPC ............ *H01M 10/448* (2013.01); *H01M 10/44* (2013.01); *G01R 31/3662* (2013.01); *G01R 31/3679* (2013.01)
USPC ............................ 320/136; 320/132; 324/430

(58) Field of Classification Search
CPC ....... Y02E 60/12; H02J 7/00; Y02T 10/7005; G01R 31/3662
USPC ........... 320/104, 127, 132, 136; 324/427, 430
See application file for complete search history.

(56) References Cited

U.S. PATENT DOCUMENTS

| 4,595,880 A | 6/1986 | Patil |
| 5,404,106 A | 4/1995 | Matsuda |
| 6,087,808 A | 7/2000 | Pritchard |
| 6,469,512 B2 | 10/2002 | Singh et al. |
| 6,842,708 B2 | 1/2005 | Odaohhara |
| 7,061,246 B2 | 6/2006 | Dougherty et al. |
| 7,541,775 B2 | 6/2009 | Lee |
| 7,683,580 B2 | 3/2010 | Matsushima et al. |
| 2008/0150491 A1 | 6/2008 | Bergveld et al. |
| 2009/0027056 A1 | 1/2009 | Huang et al. |
| 2009/0326842 A1 | 12/2009 | Thomas-Alyea |
| 2011/0313652 A1* | 12/2011 | Hancock ...................... 701/201 |

FOREIGN PATENT DOCUMENTS

| GB | 2377833 | | 1/2003 |
| JP | 60140163 | A | 7/1985 |
| JP | 01193675 | A | 8/1989 |
| JP | 06331715 | A | 12/1994 |

(Continued)

OTHER PUBLICATIONS

Search Report and Written Opinion from corresponding EP Application No. 12171099.0-1227 dated Oct. 4, 2012.

(Continued)

*Primary Examiner* — Edward Tso
*Assistant Examiner* — Aaron Piggush
(74) *Attorney, Agent, or Firm* — Joseph J. Christian

(57) ABSTRACT

Battery management systems and methods related to predicting power-delivery performance are provided. In one embodiment, a method for predicting power-delivery performance for a battery includes retrieving a plurality of battery operating parameters for a selected discharge cycle, calculating an offset indicative of a difference between a modeled internal resistance of the battery and an observed internal resistance generated from a calibration discharge cycle of the battery prior to the selected discharge cycle, and outputting a battery power-delivery performance prediction based on an offset-corrected internal resistance indicative of a difference between a modeled internal resistance based on the plurality of battery operating parameters for the selected discharge cycle and the offset.

17 Claims, 4 Drawing Sheets

(56) References Cited

FOREIGN PATENT DOCUMENTS

| | | | |
|---|---|---|---|
| JP | 2000214238 A | 8/2000 | |
| JP | 2003348707 A | 12/2003 | |
| JP | 2004028861 A | 1/2004 | |
| JP | 2009244057 A | 10/2009 | |
| JP | 2010286400 A | 12/2010 | |
| JP | 2012042337 A | 3/2012 | |
| WO | 2009025307 A1 | 2/2009 | |

OTHER PUBLICATIONS

Unofficial English translation of Office Action issued in connection with corresponding JP Application No. 2012-129409 on Jan. 28, 2014.

Office Action issued in connection with corresponding JP Application No. 2012-129409 on Jun. 10, 2014.

* cited by examiner

SYSTEMS AND METHODS FOR PREDICTING BATTERY POWER-DELIVERY PERFORMANCE

FIELD

The subject matter disclosed herein relates to predicting power-delivery performance for a battery.

BACKGROUND

Various power applications require reliable battery operation and accurate monitoring during operation. For example, an Uninterruptible Power Supply (UPS) provides backup power to a load, such as a computing or telecommunications device, when a primary power source has stopped providing power (e.g., due to failure). Accurate monitoring of the UPS battery charge state facilitates a user to suitably save information and shutdown the device before the UPS reaches end-of-discharge. As another example, a vehicle battery provides power to propel an electric vehicle. Accurate monitoring of the vehicle battery charge state provides an indication to an operator of the electric vehicle of how long they can drive the electric vehicle before stopping to charge the vehicle battery.

In one approach, a battery system provides battery status indicators that are based on state of charge (SOC) or voltage. In another approach, a battery system attempts to track power delivery by correlating capacity and initial resistance of the battery through off-line testing prior to use. In yet another approach, an indication of battery status is derived from counting discharge cycles or charge throughput and reporting on a relative health degradation based upon a-priori testing of a battery on a standardized load test.

BRIEF DESCRIPTION OF THE INVENTION

However, the inventors herein have identified issues with the above described approaches. For example, these approaches do not determine the time for which the battery can be used under a particular load cycle. For example, during lightly loaded conditions the battery can be utilized for longer durations than at highly loaded power levels. Accordingly, the battery is generally under-utilized to avoid a failure in the power system, or a battery system has to be regularly tested to check whether it can still provide sufficient back-up run time. As another example, these approaches provide battery status indication based on a-priori testing and do not provide any dynamic update of the testing to account for variance in battery behavior, such as due to aging.

In one embodiment, a method for predicting power-delivery performance for a battery, comprises retrieving a plurality of battery operating parameters for a selected discharge cycle, calculating an offset indicative of a difference between a modeled internal resistance of the battery and an observed internal resistance generated from a calibration discharge cycle of the battery prior to the selected discharge cycle, and outputting a battery power-delivery performance prediction based on an offset-corrected internal resistance indicative of a difference between a modeled internal resistance based on the plurality of battery operating parameters and the offset.

By building a model of battery usage data including past behavior and characterization of an internal resistance, battery power-delivery performance prediction accuracy may be increased. Moreover, by dynamically updating the model through application of an offset derived from recent battery behavior, battery power-delivery performance prediction accuracy may be maintained even as the battery behavior changes, such as due to aging.

This brief description is provided to introduce a selection of concepts in a simplified form that are further described herein. This brief description is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure. Also, the inventor herein has recognized any identified issues and corresponding solutions.

BRIEF DESCRIPTION OF THE DRAWINGS

The present invention will be better understood from reading the following description of non-limiting embodiments, with reference to the attached drawings, wherein below.

DETAILED DESCRIPTION

Figure 1:
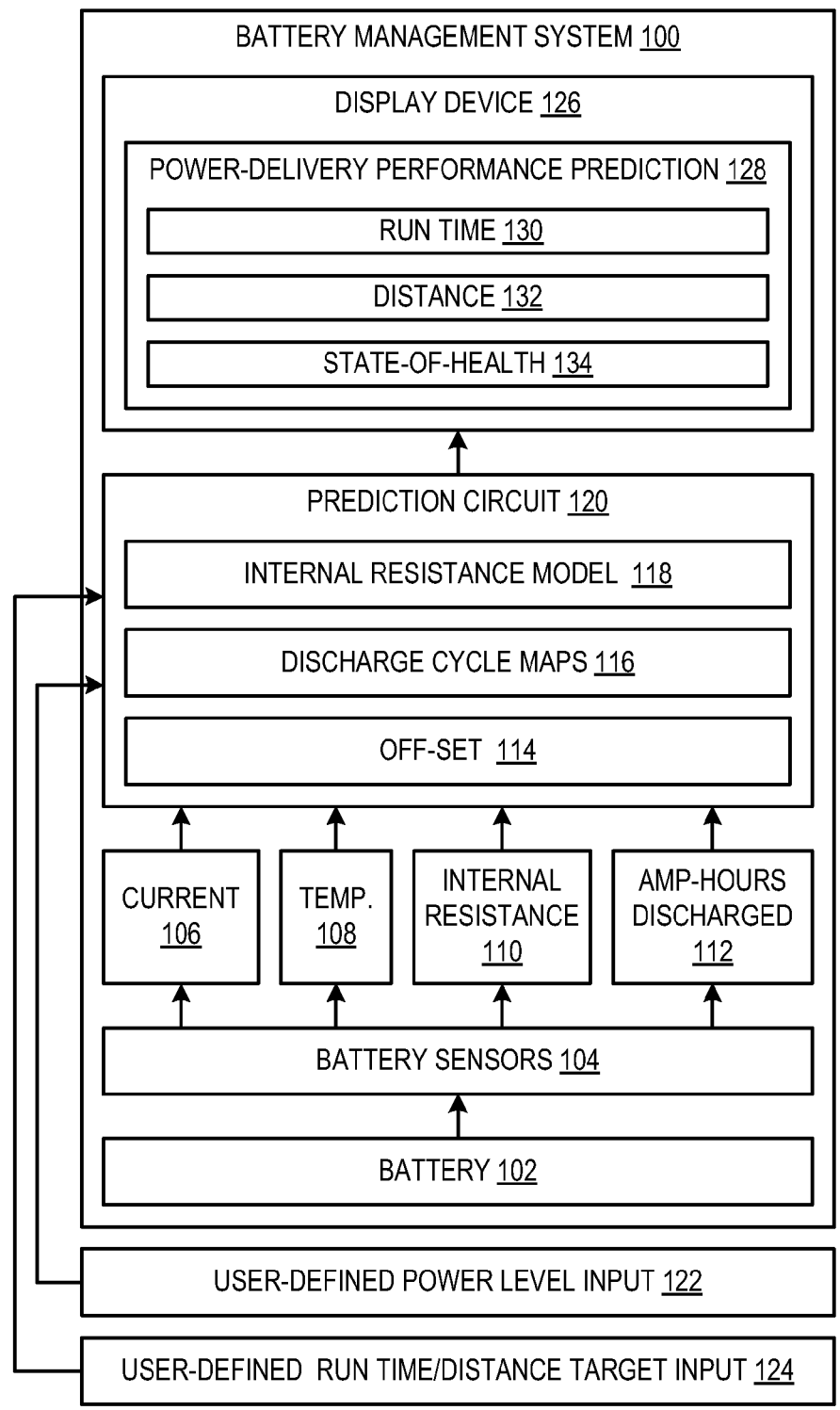
FIG. 1 is a schematic diagram that shows an embodiment of a battery management system of the present disclosure.

The present description relates to systems and methods for predicting power-delivery performance for a battery. More particularly, a power delivery performance prediction is made by modeling and dynamically updating an internal resistance characteristic from power discharge cycle traces. The internal resistance characteristic is modeled versus a charge state (e.g., measured in Amp-Hours). Depending on operating conditions, an internal resistance versus charge state model or curve is derived from observed measurements of battery operating parameters, previously stored values of battery operating parameters over a full discharge cycle, or extrapolation from limited battery operating parameter data (e.g., collected from a partial discharge cycle). The model that is built on the battery operating parameters is applied to a power discharge rate that is approximately constant or predictable over the course of a discharge event to produce an accurate prediction of power-delivery performance of the battery. By providing a prediction of power-delivery performance, such as a battery run time or distance before the battery will reach end of discharge, a user is informed of an actual capability of the battery, rather than an indirect metric like charge status, or number of discharge cycles.

Furthermore, the prediction model of battery behavior is updated over time by deriving an offset from an internal resistance observed from a calibration cycle of the battery. The offset compensates for changes in battery discharge behavior due to aging. By updating the model with an offset, predictions of power-delivery performance may remain accurate even as a battery ages and discharge behavior changes.

In some implementations, a power level at which the predicted power-delivery performance is evaluated, as well as a minimum acceptable performance target is user-defined or user-adjustable. In other words, different users have an option to adjust the power flow rate in Watts, rather than always use a maximum power rating. Accordingly, different users can tune the battery management system to provide power-delivery performance predictions that meet their specific needs. As an example, a first user sets a run time target at 10 minutes at a historical average power flow, while a second user sets a run time target at 14 minutes at full rated power flow. For each user defined target and power flow, a power-delivery performance prediction is evaluated differently to take into consideration the user-defined inputs. Accordingly, suitable battery utilization for various applications and users can be achieved in a simple and dynamic fashion. In contrast, systems without user adjustable inputs would need to repeatedly load test each battery at different rates or times to determine acceptable behavior to achieve suitable utilization.

The herein described battery management systems and methods provide a programmable and flexible battery power-delivery performance predictor to reduce battery under-utilization and to reduce off-line or special testing. Moreover, these battery management systems and methods provide an accurate indication of battery state-of-health (SOH) that is dependent on user-defined load dynamics, account for recent battery degradation and are flexible to user specific end-of-useful life specifications.

FIG. 1 is a schematic diagram that shows an embodiment of a battery management system 100 of the present disclosure. The battery management system 100 couples to a battery 102 to monitor battery performance to ensure that the battery is operating within suitable operating boundaries. The battery management system 100 includes a plurality of battery sensors 104, a prediction circuit 120, and a display device 126.

The plurality of battery sensors 104 are coupled to or are located internal to the battery 102. The plurality of battery sensors 104 includes any suitable device or configuration for observing operating parameters of the battery 102. Non-limiting examples of battery sensors that may be implemented include an ammeter, a voltmeter, an ohmmeter, thermocouples, etc. The plurality of battery sensors 104 send sensor signals indicative of battery operating parameters to the prediction circuit 120. In the illustrated implementation, the plurality of battery sensors 104 sends a current signal 106, a temperature signal 108, an internal resistance signal 110, and a charge state or amp-hours discharged signal 112 to the prediction circuit 120.

The prediction circuit 120 is operable to receive the sensor signals 106, 108, 110, and 112 from the plurality of battery sensors 104 and implement an algorithm based on operating parameters corresponding to the sensor signals to build a mathematical model 118 that describes the relationship between battery internal resistance and charge state (amp-hours discharged). The algorithm is based on laboratory test results from fresh battery discharge cycle strings. The model is applied during a discharge cycle to predict battery power-delivery performance (e.g., battery run-time to end-of-discharge capability) in what is referred to as operation in an online mode. The prediction circuit 120 operates in the online mode during a present discharge cycle and updates the power-delivery performance prediction periodically throughout the discharge cycle. For example, the prediction circuit 120 receives sensor signals from the plurality of sensors 104 every 5 seconds and correspondingly updates the prediction of power-delivery performance.

The prediction circuit 120 stores discharge cycle maps 116 of previous battery discharge cycles of the battery 102. Each of the discharge cycle maps 116 includes a mapping of operating parameters received from the plurality of sensors 104 for the duration of the discharge cycle. In some cases, a discharge cycle is a partial discharge of the battery and a partial mapping or curve is generated from operating parameters received during the partial discharge cycle. In some cases, a discharge cycle is a full discharge of the battery and a full mapping or curve is generated from the operating parameters received during the full discharge cycle.

Since the internal resistance model 118 is based on a-priori testing of discharge cycles of a fresh battery, over time as the battery 102 ages the observed discharge cycle maps deviate from predictions generated from the internal resistance model 118. To compensate for this deviation, the prediction circuit 120 calculates an offset 114 that is applied to the internal resistance model 118 to maintain prediction accuracy between the internal resistance model 118 and the observed discharge cycle maps 116. The prediction circuit 120 calculates the offset 114 by applying operating parameters from a calibration discharge cycle to the internal resistance model 118. The calibration discharge cycle is a recent discharge cycle that is selected from the discharge cycle maps 116. The calibration discharge cycle accurately represents current battery behavior. In some cases, the calibration cycle is a partial discharge cycle. In some cases, the calibration discharge cycle is a full discharge cycle. An example of calibration discharge cycle selection will be discussed in further detail below with reference to FIG. 4.

The offset 114 is indicative of a difference between a modeled internal resistance of the battery 102 and an observed internal resistance generated from the calibration discharge cycle of the battery. When operating in the online mode, the prediction circuit 120 applies the offset 114 to a modeled internal resistance generated by the internal resistant model 118 based on operating parameters for the current discharge cycle. The prediction circuit 120 outputs a battery power-delivery performance prediction 128 based on an offset-corrected internal resistance to the display device 126. The offset-corrected internal resistance is indicative of a difference between the modeled internal resistance based on the plurality of battery operating parameters for the current discharge cycle and the offset. In the online mode, the battery power-delivery performance prediction 128 is applicable to the current discharge cycle.

In some implementations, the prediction circuit 120 is operable in an offline mode to provide an instantaneous prediction of power-delivery performance of the battery 102 for a next discharge cycle when the battery is not currently operating in a discharge cycle. In the offline mode, the prediction circuit 120 retrieves a plurality of stored battery operating parameters from a previous discharge cycle by selecting one of the discharge cycle maps 116. In some implementations, the stored battery operating parameters are retrieved from the most recent discharge cycle. In some implementations, the stored battery operating parameters are retrieved from a recent full discharge cycle or a discharge cycle where the battery is discharge greater than a threshold charge state (e.g., a threshold amount of Amp-hours discharged). The prediction circuit 120 calculates the offset 114 from the calibration discharge cycle of the battery 102 in the same manner as operation in the online. The prediction circuit 120 applies the offset 114 to a modeled internal resistance generated by the internal resistant model 118 based on stored operating parameters from the selected discharge cycle map. The prediction circuit 120 outputs a battery power-delivery performance prediction 128 based on an offset-corrected internal resistance to the display device 126. The offset-corrected internal resistance is indicative of a difference between a modeled internal resistance based on the plurality of stored battery operating parameters from the selected discharge cycle map and the offset. In the offline mode, the battery power-delivery performance prediction 128 is applicable to a next discharge cycle.

In some implementations, the prediction circuit 120 is user programmable or adjustable in the manner in which the power-delivery performance prediction is evaluated. In other words, the power-delivery performance prediction is adjustable to meet the requirements of different application as defined by a user. In particular, the prediction circuit 120 is operable to receive a user-defined power level 122. The user-defined power level 122 is a power level at which the battery 102 is assumed to be operating at for the remainder of a discharge cycle for application to the internal resistance model 118. For example, a user-defined power level may be set at a full rated or maximum power level. As another example, a user-defined power level may be set at an average or partial power level. The prediction circuit 120 outputs the battery power-delivery performance prediction 128 to the display device 126 based on the offset-corrected internal resistance and the user-defined power level 122. In some implementations, the user-defined power level 122 is programmed into the prediction circuit 120 and stored in memory. In some implementations, the user-defined power level 122 is received from a remote storage location, such as from another computing device. In some applications, the user-defined power level 122 is user-adjustable and the power-delivery performance prediction 128 is adjusted in response to receiving a user-adjusted power level.

In some implementations, the prediction circuit 120 is operable to receive a user-defined target time 124 (or target distance). The user-defined target time 124 is tolerance for a minimum acceptable run time to define a battery state-of-health for a particular application. For example, a user-defined target time for one application may be set to a minimum of 10 minutes at an average power flow rate. As another example, a user-defined target time for a different application may be set to a minimum of 14 minutes at a full rated power flow. As yet another example, a user-defined target distance may be set to a minimum of 10 miles at an average power flow rate. This example may be applicable to an electric vehicle. The prediction circuit may take into consideration the user-defined target time 124 when output a battery state-of-health as part of the power-delivery performance prediction 128. Accordingly, the prediction circuit 120 adjusts the battery state-of-health in response to an adjustment of the user-defined target time. Accordingly, the power-delivery performance prediction may be adjusted by a user to meet the needs of a specific application. Moreover, the prediction may be dynamically tuned through user-adjustment to compensate for variations in the application of the battery.

In some implementations, the prediction circuit 120 is implemented as software performed by a computing device, such as a microcontroller that includes a processor and memory. In some implementations, the prediction circuit 120 is implemented as one or more hardware or firmware logic machines configured to execute hardware or firmware instructions. In some implementations, the prediction circuit 120 is implemented as a combination of hardware and software.

The display device 126 presents a visual representation of the power-delivery performance prediction 128 received from the prediction circuit 120. The display device 126 utilizes virtually any type of display technology. The display device 126 is operable to display the battery power-delivery performance prediction 128. In some implementations, the battery power-delivery performance prediction 128 includes a run time 130 or a time remaining till the battery 102 reaches an end-of-discharge internal resistance. In some implementations, the battery power-delivery performance prediction 128 includes a distance 130 till the battery reaches an end-of-discharge internal resistance. For example, the distance 130 is a travel distance of an electric vehicle at a set power rate till the battery reaches the end-of-discharge internal resistance. In some implementations, the battery power-delivery performance prediction 128 includes a battery state-of-health (SOH) 132 indicating whether the battery can deliver power for at least a target time. For example, a 100% SOH indicates that the battery can deliver power for at least the target time. As another example, a 0% SOH indicates that the battery cannot deliver the desired power level for the target time.

A specific example of the internal resistance model 118 and corresponding algorithm used to predict the remaining discharge time of a battery is described herein. In this example, this model, shown below, was previously developed based on laboratory test results from fresh battery strings for a particular battery type. The model is applicable to different battery types; however the mathematical variables may vary depending on battery type.

$$Res = \exp(a1*Temp + b1*Ah - c1*Temp*Ah)$$

Where

Res is the internal resistance of the battery

Temp is the operating temperature of the battery

Ah is the amount of charge discharged during the current discharge event a1, b1, and c1 are battery management system specific variables that are calibrated for a particular battery For effective use in real-life or non-ideal applications, the model needs to be updated dynamically to accommodate battery degradation over time as well as battery specific characteristics. A dynamic update scheme which utilizes observed results from a recent discharge cycle (referred to as the "calibration discharge cycle") is illustrated herein. Table x, shown below, presents a Resistance vs. Amp-hours mapping for a calibration discharge cycle.

TABLE x

Resistance vs. Ah Mapping from the Calibration Cycle

| Amp-hours Discharged | Resistance | Average Current | Temp | Time Remaining |
|---|---|---|---|---|
| Ax1 | Rx1 | Cx1 | Tx1 | Sx1 |
| Ax2 | Rx2 | Cx2 | Tx2 | Sx2 |
| Ax3 | Rx3 | Cx3 | Tx3 | Sx3 |
| Ax4 | Rx4 | Cx4 | Tx4 | Sx4 |
| Ax5 | Rx5 | Cx5 | Tx5 | Sx5 |

Table y, shown below, presents a Resistance vs. Amp-hours mapping for what is assumed to be the current discharge cycle for purposes of this example. The Resistance after discharging to the end-of-discharge state was R_term=Rx5. Note there is a difference between the Resistance (Rx5) at the end of the calibration discharge cycle and the Resistance (Ry5) at the end of the current discharge cycle.

TABLE y

Resistance vs. Ah Mapping for the Current Cycle

| Amp-hours Discharged | Resistance (ohms) | Average Current | Temp (deg C.) | Time Remaining (sec) |
|---|---|---|---|---|
| Ay1 | Ry1 | Cy1 | Ty1 | Sy1 |
| Ay2 | Ry2 | Cy2 | Ty2 | Sy2 |
| Ay3 | Ry3 | Cy3 | Ty3 | Sy3 |

TABLE y-continued

Resistance vs. Ah Mapping for the Current Cycle

| Amp-hours Discharged | Resistance (ohms) | Average Current | Temp (deg C.) | Time Remaining (sec) |
|---|---|---|---|---|
| Ay4 | Ry4 | Cy4 | Ty4 | Sy4 |
| Ay5 | Ry5 | Cy5 | Ty5 | Sy5 |

The purpose of the model is to accurately predict the run time to the end-of-discharge of the battery. Thus, to compensate for changes in battery behavior an offset is applied to the algorithm in order to have the modeled results substantially match the observed results (shown on the last column of the table). Table xx shows the results from applying the algorithm to the calibration discharge cycle. The last column shows the offset between the actual results and model predictions. These offset values are used to correct the predictions for the present discharge cycle.

TABLE xx

Calibration Cycle: Calculation of Offsets

| Amp-hours Discharged | Amp-hours at End-of-Discharge Resistance | Offset |
|---|---|---|
| Axx1 | Rxx1 | Oxx1 |
| Axx2 | Rxx2 | Oxx2 |
| Axx3 | Rxx3 | Oxx3 |
| Axx4 | Rxx4 | Oxx4 |
| Axx5 | Rxx5 | Oxx5 |

The calculations for a charge state of Ay1 will be described herein. From the mathematical model above, Ah_term can be obtained by inverting the model to solve for Ah_term:

$$Ah\_term = (\log e(Res\_term) + a1*Temp)/(c1*Temp)$$

The values from Table x can be plugged into the above equation to solve for Ah_term.

$$Ah\_term = (\log e(Rx5) + a1*Tx1)/(c1*Tx15) = Rxx1$$

Ah_term is known to be Axx5 as observed from the calibration cycle. Thus, the offset (difference between the observed result and model prediction) is Rxx1−Axx5=Oxx1. This offset is attributed to a large extent to battery degradation over time. The offset is applied to the mathematical model to predict the run time for the current discharge cycle. Table yy, show below, illustrates how the offset from the calibration cycle improves the model based predictions for the present cycle.

TABLE yy

Current Cycle Predicting time remaining to reach end-of-discharge Resistance

| Amp-hours Discharged | Offset Between Modeled and Corrected Amp-hours at End-of-Discharge Resistance | Offset Between Modeled Time Remaining and Actual Time Remaining |
|---|---|---|
| Ayy1 | 1.7 | 0 |
| Ayy2 | 1.8 | 0.1 |
| Ayy3 | 2.1 | 0.2 |
| Ayy4 | 2.2 | 0.2 |
| Ayy5 | 2.4 | 0.3 |

The offset corrected calculations for the current discharge cycle at a charge state can be obtained by plugging in values from Table y into the above equation to solve for Ah_term. The offset from the calibration cycle is applied to the modeled Ah_term for the current cycle to yield the offset corrected Ah_term. Lastly, the estimated time to the end of discharge is calculated.

$$(Ah\_term - Ah\_obs)/Current * Seconds = \text{Time remaining (e.g., in minutes)}$$

An examination of the right-side column of Table yy reveals that the algorithm based predictions are in substantial agreement with their observed (actual) counterparts. In other words, by applying the offset to the modeled result, the prediction accuracy may be maintained even as the battery behavior changes.

Figure 2:
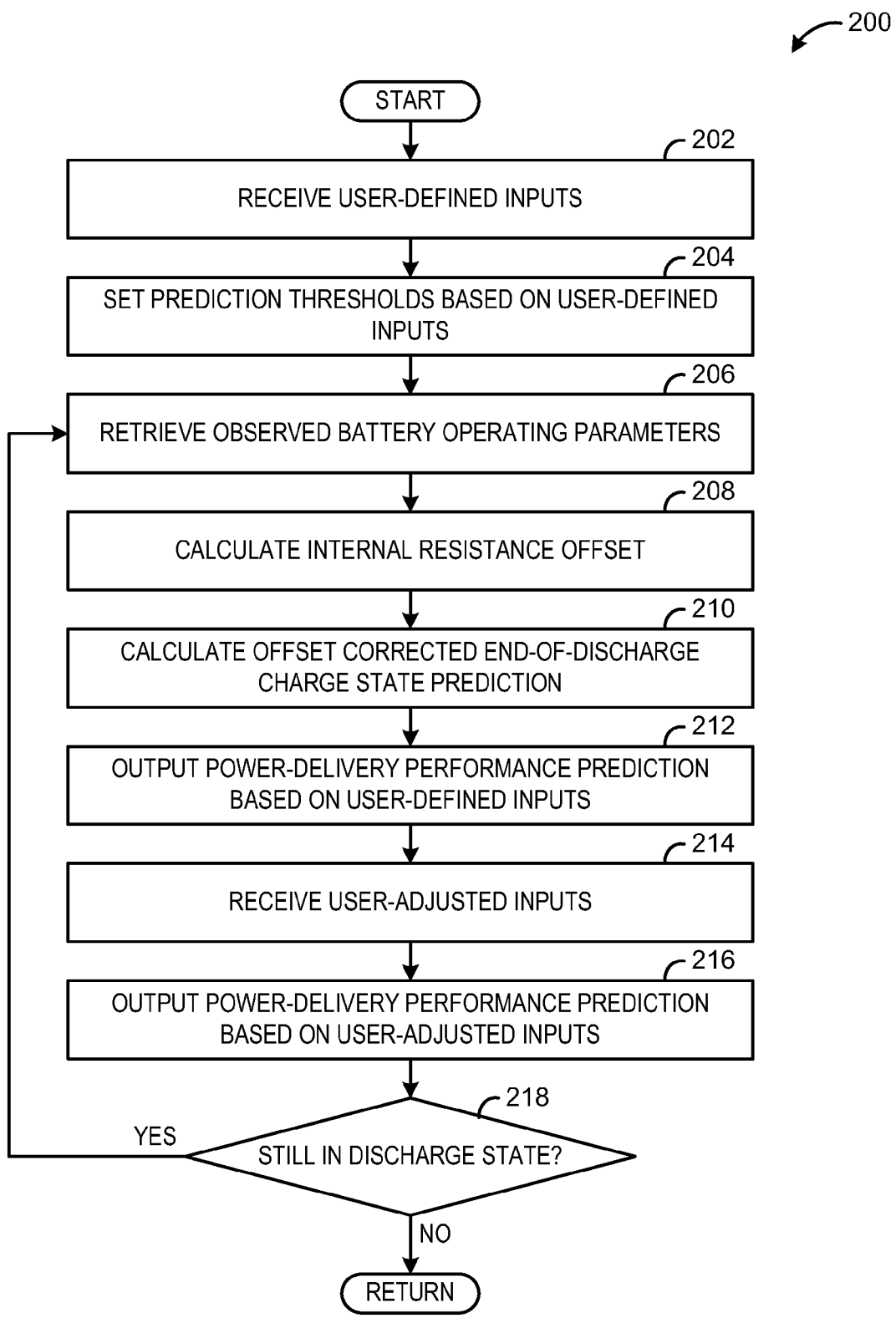
FIG. 2 is a flow diagram of an embodiment of an online method for predicting power-delivery performance for a battery.

FIG. 2 is a flow diagram of an embodiment of an online method 200 for predicting power-delivery performance for a battery. For example the method 200 may be performed by the battery management system 100 of FIG. 1 during a discharge cycle of the battery 102. At 202, the method 200 includes receiving user-defined inputs. In some implementations, the user-defined inputs include a user-defined power level. In some implementations, the user-defined inputs include a user-defined target time. In some implementations, the user-defined inputs include a user-defined target distance.

At 204, the method 200 includes setting prediction thresholds based on the user-defined inputs. The prediction thresholds define how the predicted power-delivery performance is evaluated in the internal resistance model. For example, the prediction thresholds define at which power level a predicted run time is evaluated. Furthermore, setting the predictions thresholds include setting an internal resistance value of the battery that defines an end-of-discharge.

At 206, the method 200 includes retrieving observed operating parameters. The battery operating parameters are retrieved for a current discharge cycle of the battery in real time. For example, the battery operating parameters include an operating current, an operating temperature, an observed internal resistance, and a charge state. The observed battery operating parameters are retrieved from battery sensors throughout the current discharge cycle. For example, sensor signals are received from the battery sensors every 5 seconds during the current discharge cycle.

At 208, the method 200 includes calculating an internal resistance offset. The internal resistance offset is indicative of a difference between a modeled internal resistance of the battery and an observed internal resistance generated from a calibration discharge cycle of the battery. The modeled internal resistance is a function of the charge state and temperature of the battery. The modeled internal resistance is derived from discharge cycles of a fresh battery, while the calibration discharge cycle is indicative of discharge behavior of the battery due to aging. The offset is applied to the current discharge cycle to compensate for the difference between the modeled internal resistance and the observed internal resistance.

At 210, the method 200 includes calculating an offset corrected end-of-discharge charge state prediction for the current battery discharge cycle. The end-of-discharge charge state is predicted by inverting the internal resistance model to solve for end-of-discharge charge state. In particular, the end-of-discharge charge state is a function of a difference of the end-of-discharge internal resistance and the offset and the temperature of the battery.

At 212, the method 200 includes outputting a battery power-delivery performance prediction based on the offset-corrected internal resistance and the user-defined inputs in real time during the current discharge cycle. The offset-corrected internal resistance is indicative of a difference between a modeled internal resistance based on the plurality of battery operating parameters from the current discharge cycle and the offset. The power-delivery performance prediction may include one or more of a run time, a distance, or state-of-health.

At 214, the method 200 includes receiving user-adjusted inputs. The user-adjusted inputs may include a power level and minimum run time threshold. The user-adjusted inputs differ from the user-defined inputs.

At 216, the method 200 includes outputting a battery power-delivery performance prediction based on the offset-corrected internal resistance and the user-adjusted inputs in real time during the current discharge cycle.

At 218, the method 200 includes determining if the battery is discharging in the current discharge cycle. For example, this is determined based on whether the internal resistance of the battery has reached an end-of-discharge internal resistance. If the battery is still discharging, the method moves to 206. Otherwise, the method returns to other operations.

Figure 3:
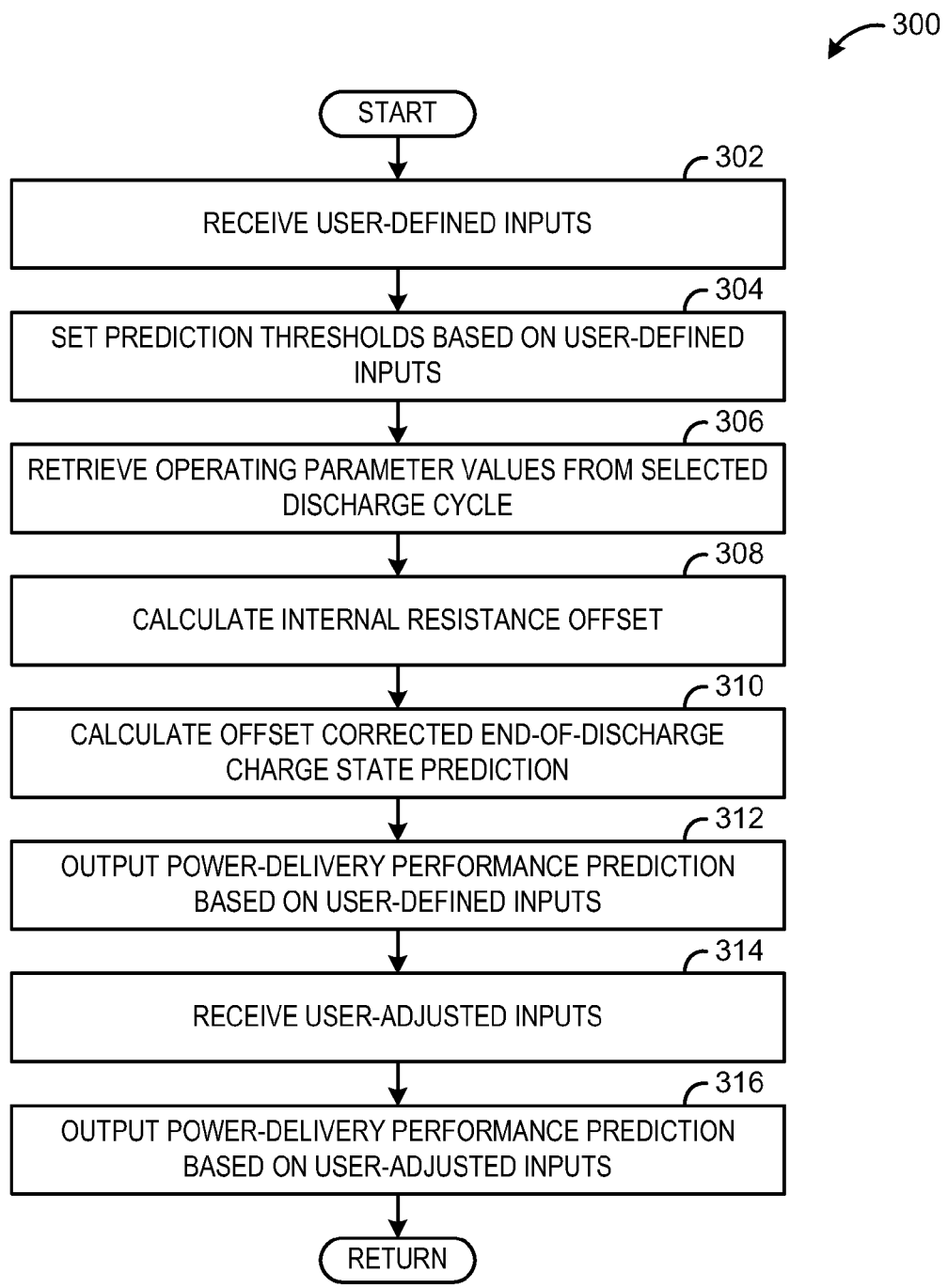
FIG. 3 is a flow diagram of an embodiment of an offline method for predicting power-delivery performance for a battery.

FIG. 3 is a flow diagram of an embodiment of an offline method 300 for predicting power-delivery performance for a battery. For example the method 300 may be performed by the battery management system 100 of FIG. 1 in between discharge cycles of the battery 102. At 302, the method 300 includes receiving user-defined inputs. At 304, the method 300 includes setting prediction thresholds based on the user-defined inputs.

At 306, the method 300 includes retrieving battery operating parameters stored from a selected previous discharge cycle. For example, the battery operating parameters may be stored from the most recent discharge cycle. As another example, the battery operating parameters may be stored from the most recent full discharge cycle.

At 308, the method 300 includes calculating the internal resistance offset. The internal resistance offset is indicative of a difference between a modeled internal resistance of the battery and an observed internal resistance generated from a calibration discharge cycle of the battery. The modeled internal resistance is a function of the charge state and temperature of the battery. The modeled internal resistance is derived from discharge cycles of a fresh battery, while the calibration discharge cycle is indicative of discharge behavior of the battery due to aging. The offset is applied to the selected previous discharge cycle to compensate for the difference between the modeled internal resistance and the observed internal resistance.

At 310, the method 300 includes calculating an offset corrected end-of-discharge charge state prediction for the next battery discharge cycle. The end-of-discharge charge state is predicted by inverting the internal resistance model to solve for end-of-discharge charge state. In particular, the end-of-discharge charge state is a function of a difference of the end-of-discharge internal resistance and the offset and the temperature of the battery.

At 312, the method 300 includes outputting a battery power-delivery performance prediction based on the offset-corrected internal resistance and the user-defined inputs. The offset-corrected internal resistance is indicative of a difference between a modeled internal resistance based on the plurality of battery operating parameters from the selected previous discharge cycle and the offset. The power-delivery performance prediction may include one or more of a run time, a distance, or state-of-health.

At 314, the method 300 includes receiving user-adjusted inputs. The user-adjusted inputs may include a power level and minimum run time threshold. The user-adjusted inputs differ from the user-defined inputs.

At 316, the method 300 includes output a battery power-delivery performance prediction based on the offset-corrected internal resistance and the user-adjusted inputs.

The above described methods may be employed to predict battery power-delivery performance during a battery discharge cycle (i.e., online) or predict battery power-delivery performance for a next battery discharge cycle (i.e., offline). In both methods, by updating the model that describes the relationship between battery internal resistance and charge state with an offset that is derived from recent observed operating parameters of the battery, accuracy of the power-delivery performance prediction is maintained even as the battery ages. Furthermore, by adjusting the battery power-delivery performance prediction based user-defined inputs, the prediction is tuned for specific applications and user needs.

Figure 4:
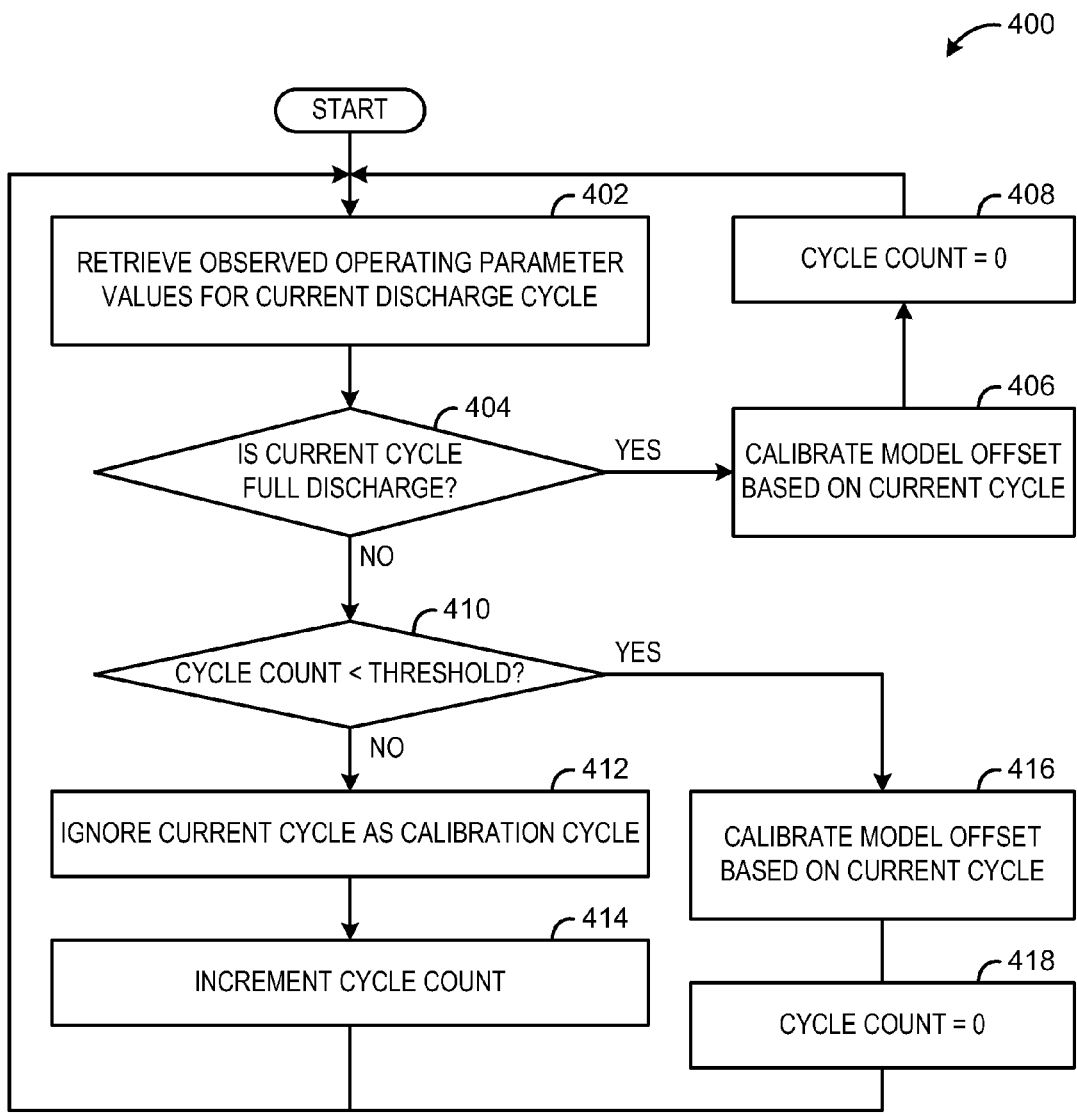
FIG. 4 is a flow diagram of an embodiment of a method for selecting a discharge cycle for calibrating a battery power-delivery performance prediction model.

FIG. 4 is a flow diagram of an embodiment of a method 400 for selecting a discharge cycle for calibrating a battery power-delivery performance prediction model. For example the method 400 may be performed by the battery management system 100 of FIG. 1. At 402, the method 400 includes retrieving observed operating parameters for the current discharge cycle. The observed operating parameters are retrieved from batter sensors in the form of sensor signals. The battery operating parameters include an operating current, an operating temperature, an observed internal resistance, and a charge state.

At 404, the method 400 includes it is determined whether the current discharge cycle is a full discharge cycle based on the operating parameters. For example, the determination is made based on whether the internal resistance reaches an end-of-discharge internal resistance. If it is determined that the current discharge cycle is a full discharge cycle, the method moves to 406. Otherwise, the method moves to 410.

At 406, the method 400 includes calibrating the model offset based on the current cycle. In other words, the current cycle is selected as the calibration cycle that is used to derive the offset, because the current cycle is a full discharge cycle. The full discharge of the battery provides a more complete mapping of the relationship of the internal resistance versus charge state, which results in a more accurate prediction of battery behavior.

At 408, the method 400 includes making a cycle count equal to zero. The cycle count tracks the number of discharge cycles that occur between full battery discharge cycles.

At 410, the method 400 includes determining if the cycle count is less than a cycle count threshold. The cycle count threshold may be set to any suitable number of discharge cycles before the model generates a power-delivery performance prediction that differs from an observed prediction by a specified tolerance. For example, the cycle count threshold may be set to 200 discharge cycles. If it is determined that the cycle count is less than the cycle count threshold, the method moves to 412. Otherwise, the method moves to 416.

At 412, the method 400 includes ignoring the current cycle as a calibration cycle. In other words the current cycle is only a partial discharge cycle and does not provide the most complete mapping of the current relationship between internal resistance and charge state, so the current cycle is ignored in favor of a previously stored discharge cycle.

At 414, the method 400 includes incrementing the cycle count and returning to 402.

At 416, the method 400 includes calibrating the model offset based on the current discharge cycle. The current discharge cycle may be used to generate the offset even though it is a partial discharge cycle because the model needs to be updated to track the current behavior of the battery. Even though the partial discharge cycle provides less than a full mapping of operating parameters. The operating parameters can be used to provide an offset that will improve prediction accuracy as the battery behavior changes relative to a model that does not provide an offset to compensate changes in battery behavior.

At 418, the method includes setting the cycle count equal to zero and returning to 402.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for predicting power-delivery performance for a battery, comprising:
   retrieving a plurality of battery operating parameters for a selected discharge cycle;
   receiving a user-defined power level;
   calculating an offset indicative of a difference between a modeled internal resistance of the battery and an observed internal resistance generated from a calibration discharge cycle of the battery prior to the selected discharge cycle;
   outputting a battery power-delivery performance prediction based on an offset-corrected internal resistance indicative of a difference between a modeled internal resistance based on the plurality of battery operating parameters and the offset; and
   outputting a battery power-delivery performance prediction based on the offset-corrected internal resistance and the user-defined power level.

2. The method of claim 1, further comprising:
   receiving a user-adjusted power level that is different from the user-defined power level; and
   outputting an updated battery power-delivery performance prediction based on the offset-corrected internal resistance and the user-adjusted power level.

3. The method of claim 1, wherein the battery power-delivery performance prediction includes a time remaining till the battery reaches an end-of-discharge internal resistance.

4. The method of claim 1, wherein the battery power-delivery performance prediction includes a vehicle travel distance till the battery reaches an end-of-discharge internal resistance.

5. The method of claim 1, wherein the battery power-delivery performance prediction includes a battery state-of-health indicating whether the battery can deliver power for at least a target time.

6. The method of claim 5, further comprising:
   receiving a user-defined target time; and
   adjusting the battery state-of-health based on the user-defined target time.

7. The method of claim 1, wherein the plurality of battery operating parameters includes an operating current, an operating temperature, an observed internal resistance, and a charge state.

8. The method of claim 1, wherein retrieving the plurality of battery operating parameters for the selected discharge cycle includes receiving a plurality of sensor signals indicative of the plurality of battery operating parameters in real time, and the battery power-delivery performance prediction is updated in real time during a current discharge cycle.

9. The method of claim 1, wherein retrieving the plurality of battery operating parameters for the selected discharge cycle includes retrieving the plurality of battery operating parameters stored from a previous discharge cycle prior to a next discharge cycle, and the battery power-delivery performance prediction applies to the next discharge cycle.

10. A method for predicting power-delivery performance for a battery, comprising:
    receiving a user-defined power level;
    retrieving a plurality of battery operating parameters for a current discharge cycle in real time;
    calculating an offset indicative of a difference between a modeled internal resistance of the battery and an observed internal resistance generated from a calibration discharge cycle of the battery prior to the current discharge cycle; and
    outputting, during the current discharge cycle, a battery power-delivery performance prediction based on an offset corrected internal resistance indicative of a difference between a modeled internal resistance based on the plurality of battery operating parameters and the offset, and the user-defined power level.

11. The method of claim 10, further comprising:
    receiving a user-adjusted power level that is different from the user-defined power level; and
    outputting an updated battery power-delivery performance prediction based on the offset-corrected internal resistance and the user-adjusted power level.

12. The method of claim 10, wherein the battery power-delivery performance prediction includes a time remaining till the battery reaches an end-of-discharge internal resistance.

13. The method of claim 10, wherein the battery power-delivery performance prediction includes a distance till the battery reaches an end-of-discharge internal resistance.

14. The method of claim 10, wherein the battery power-delivery performance prediction includes a battery state-of-health indicating whether the battery can deliver power for at least a target time.

15. The method of claim 10, wherein the calibration cycle is a full discharge cycle when a cycle count of discharge cycles without an occurrence of a full discharge cycle is less than a discharge cycle threshold and the calibration cycle is a partial discharge cycle when the cycle count of discharge cycles without an occurrence of a full discharge cycle is greater than the discharge cycle threshold.

16. A method for predicting power-delivery performance for a battery, comprising:
    retrieving a plurality of battery operating parameters for a selected discharge cycle;
    receiving a user-adjusted power level that is different from a received user-defined power level;
    calculating an offset indicative of a difference between a modeled internal resistance of the battery and an observed internal resistance generated from a calibration discharge cycle of the battery prior to the selected discharge cycle;
    outputting a battery power-delivery performance prediction based on an offset-corrected internal resistance indicative of a difference between a modeled internal resistance based on the plurality of battery operating parameters and the offset; and outputting an updated battery power-delivery performance prediction based on the offset-corrected internal resistance and a user-adjusted power level.

17. A method for predicting power-delivery performance for a battery, comprising:
- retrieving a plurality of battery operating parameters for a selected discharge cycle;
- calculating an offset indicative of a difference between a modeled internal resistance of the battery and an observed internal resistance generated from a calibration discharge cycle of the battery prior to the selected discharge cycle;
- outputting a battery power-delivery performance prediction based on an offset-corrected internal resistance indicative of a difference between a modeled internal resistance based on the plurality of battery operating parameters and the offset, wherein the battery power-delivery performance prediction includes a battery state-of-health indicating whether the battery can deliver power for at least a target time;
- receiving a user-defined target time; and
- adjusting the battery state-of-health based on the user-defined target time.

* * * * *

UNITED STATES PATENT AND TRADEMARK OFFICE
CERTIFICATE OF CORRECTION

| | |
|---|---|
| PATENT NO. | : 8,872,481 B2 |
| APPLICATION NO. | : 13/095743 |
| DATED | : October 28, 2014 |
| INVENTOR(S) | : Chawla et al. |

Page 1 of 1

It is certified that error appears in the above-identified patent and that said Letters Patent is hereby corrected as shown below:

In the Specification

In Column 5, Line 67, delete "distance 130" and insert -- distance 132 --, therefor.

In Column 6, Line 1, delete "distance 130" and insert -- distance 132 --, therefor.

In Column 6, Line 6, delete "(SOH) 132" and insert -- (SOH) 130 --, therefor.

Signed and Sealed this
Third Day of February, 2015

Michelle K. Lee
*Deputy Director of the United States Patent and Trademark Office*